(12) United States Patent
Kharas

(10) Patent No.: US 7,657,143 B2
(45) Date of Patent: Feb. 2, 2010

(54) METHOD FOR IMPROVING REFRACTIVE INDEX CONTROL IN PECVD DEPOSITED A-SIN$_y$ FILMS

(75) Inventor: Boris Kharas, Brooklyn, NY (US)

(73) Assignee: Novatronix Corporation, Seoul (KR)

( * ) Notice: Subject to any disclaimer, the term of this patent is extended or adjusted under 35 U.S.C. 154(b) by 0 days.

(21) Appl. No.: 11/545,077

(22) Filed: Oct. 6, 2006

(65) Prior Publication Data

US 2007/0144215 A1    Jun. 28, 2007

Related U.S. Application Data

(60) Provisional application No. 60/724,385, filed on Oct. 7, 2005.

(51) Int. Cl.
*G02B 6/10* (2006.01)
(52) U.S. Cl. ..................... 385/129; 372/50.1
(58) Field of Classification Search ............. 65/421; 385/49–42; 257/85; 438/31
See application file for complete search history.

(56) References Cited

U.S. PATENT DOCUMENTS

| | | | | |
|---|---|---|---|---|
| 3,652,324 A * | 3/1972 | Chu et al. | ..................... | 438/694 |
| 5,124,762 A * | 6/1992 | Childs et al. | ................. | 257/192 |
| 5,209,803 A * | 5/1993 | Powell | .................. | 156/345.47 |
| 5,470,661 A * | 11/1995 | Bailey et al. | ................. | 428/408 |
| 5,569,501 A * | 10/1996 | Bailey et al. | ................. | 427/577 |
| 5,591,989 A * | 1/1997 | Miyasaka et al. | ............. | 257/66 |
| 5,624,873 A * | 4/1997 | Fonash et al. | ................ | 438/487 |
| 5,637,512 A * | 6/1997 | Miyasaka et al. | ............ | 438/166 |
| 5,811,323 A * | 9/1998 | Miyasaka et al. | ............ | 438/151 |
| 5,858,621 A * | 1/1999 | Yu et al. | ...................... | 430/313 |
| 5,968,324 A * | 10/1999 | Cheung et al. | .......... | 204/192.28 |
| 6,046,736 A * | 4/2000 | Atherton | ...................... | 345/211 |
| 6,057,182 A * | 5/2000 | Goodman et al. | ............ | 438/162 |
| 6,109,717 A * | 8/2000 | Kane et al. | ...................... | 347/12 |

(Continued)

FOREIGN PATENT DOCUMENTS

EP    778496 A2 *  6/1997

(Continued)

OTHER PUBLICATIONS

Hsieh et al.; "Properties of plasma-enhanced chemical-vapor-deposited a-SiNx:H by various dilution gases;" J.Appl. Phys. 76(6); Sep. 15, 1994; pp. 3645-3655.*

(Continued)

*Primary Examiner*—Frank G Font
*Assistant Examiner*—Peter Radkowski
(74) *Attorney, Agent, or Firm*—Drinker, Biddle & Reath LLP

(57) ABSTRACT

An apparatus, device, system, and method for controlling the index of refraction of at least one layer of amorphous silicon-based film deposited on a substrate are disclosed. The apparatus, device, system and method include providing at least one volume of each of $N_2$, $SiH_4$, and He, and depositing the at least one layer of amorphous silicon-based film on the substrate by vapor deposition. The device may include a waveguide that includes at least one layer of amorphous silicon-based film, wherein the at least one layer of amorphous silicon-based film is deposited by vapor deposition using an at least one volume of each of $N_2$, $SiH_4$, and He.

12 Claims, 2 Drawing Sheets

U.S. PATENT DOCUMENTS

| | | | |
|---|---|---|---|
| 6,229,508 B1 * | 5/2001 | Kane | 345/82 |
| 6,380,006 B2 | 4/2002 | Kido | |
| 6,434,175 B1 | 8/2002 | Zah | |
| 6,466,194 B1 * | 10/2002 | Atherton | 345/100 |
| 6,498,347 B2 * | 12/2002 | Sauer et al. | 250/338.1 |
| 6,614,977 B2 | 9/2003 | Johnson | |
| 6,658,176 B2 * | 12/2003 | Amantea | 385/16 |
| 6,778,723 B1 * | 8/2004 | Yang | 385/16 |
| 6,788,721 B2 * | 9/2004 | Yang et al. | 372/50.1 |
| 7,026,634 B2 * | 4/2006 | Livesay et al. | 250/492.3 |
| 7,129,187 B2 * | 10/2006 | Joe | 438/769 |
| 7,173,953 B2 * | 2/2007 | Wittmann et al. | 372/49.01 |
| 2001/0024186 A1 * | 9/2001 | Kane et al. | 345/98 |
| 2002/0168466 A1 * | 11/2002 | Tapphorn et al. | 427/180 |
| 2002/0176467 A1 * | 11/2002 | Yang et al. | 372/50 |
| 2003/0016895 A1 | 1/2003 | Holm et al. | |
| 2003/0038251 A1 * | 2/2003 | Livesay et al. | 250/492.3 |
| 2003/0091257 A1 * | 5/2003 | Chakrabarti et al. | 385/2 |
| 2003/0165293 A1 * | 9/2003 | Abeles et al. | 385/33 |
| 2004/0248380 A1 | 12/2004 | Aulnette | |
| 2004/0253828 A1 * | 12/2004 | Ozawa et al. | 438/710 |
| 2004/0265745 A1 | 12/2004 | Sho et al. | |
| 2006/0097190 A1 * | 5/2006 | Livesay et al. | 250/492.2 |
| 2006/0104584 A1 * | 5/2006 | Livesay et al. | 385/129 |
| 2006/0105581 A1 * | 5/2006 | Bielefeld et al. | 438/786 |
| 2007/0049011 A1 * | 3/2007 | Tran | 438/637 |

FOREIGN PATENT DOCUMENTS

JP    59218406 A  * 12/1984

OTHER PUBLICATIONS

Takahashi et al.; Polarization-Insensitive Arrayed-Waveguide Multiplexer Photonics Technology Letters, vol. 5, No. 6, Jun. 1993; pp. 707-709.*

Tsu et al., "Local atomic structure in thin films of silicon nitride and silicon deposition;" Phys. Rev. B, 33(10), 1986, pp. 7069-7076.*

Lim et al. "High quality silicon-nitride thin films grown by helium plasma-enhanced chemical vapor deposition," 1996, Vacuum Microelectronics Conference, 1996. IVMC'96., 9th International, pp. 406-410.*

* cited by examiner

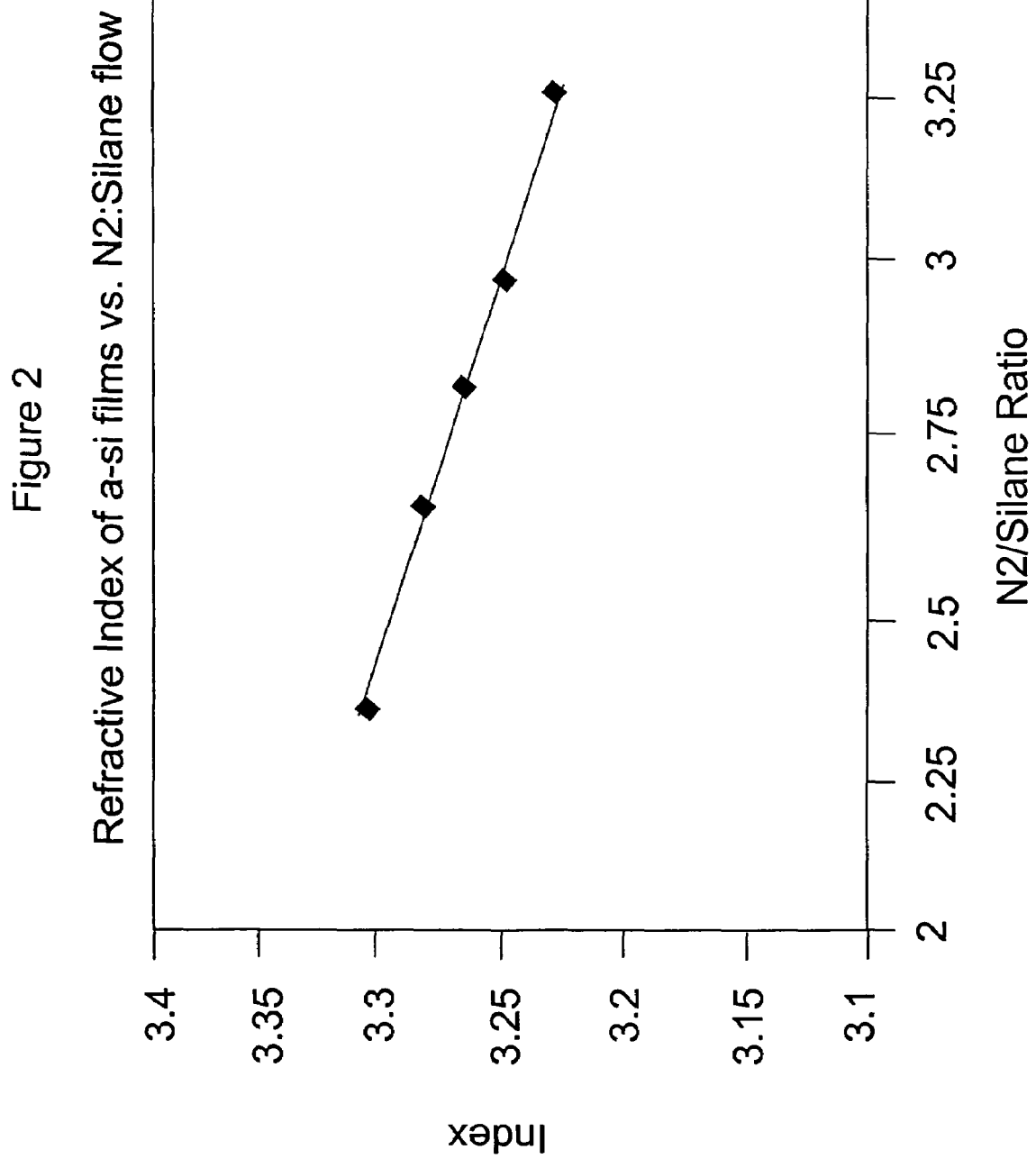

METHOD FOR IMPROVING REFRACTIVE INDEX CONTROL IN PECVD DEPOSITED A-SIN$_y$ FILMS

CROSS REFERENCE TO RELATED APPLICATIONS

This Application claims the benefit of priority to U.S. Provisional Patent Application Ser. No. 60/724,385, entitled "Method For Improving Refractive Index Control In PECVD Deposited a-SiN$_y$ Films", filed Oct. 7, 2005, the entire disclosure of which is hereby incorporated by reference as if being set forth herein in its entirety.

STATEMENT REGARDING FEDERALLY SPONSORED RESEARCH

N/A

FIELD OF THE INVENTION

The present invention is directed generally to methods of PECVD deposition, and, more particularly, to improving refractive index control in nitrogen doped a-Si films for waveguide and AWG applications.

BACKGROUND OF THE INVENTION

Optical waveguides are the cornerstone of integrated optical circuits. An optical waveguide or combination of optical waveguides is typically assembled to form devices such as couplers, splitters, ring resonators, arrayed waveguide gratings, mode transformers, and the like. These devices are further combined on an optical chip to create an integrated optical device or circuit for performing the desired optical functions, such as, for example, switching, splitting, combining, multiplexing, demultiplexing, filtering, and clock distribution. As used herein, the expression "integrated optical circuits" may include a combination of optically transparent elongated structures for guiding, manipulating, or transforming optical signals that are formed on a common substrate or chip of monolithic or hybrid construction.

Typically, formation of the waveguide begins with formation of the lower optical cladding on a suitable substrate, followed by formation of an optical core, typically by chemical vapor deposition, lithographic patterning, and etching, and finally, surrounding the core with an upper optical cladding layer. For example, a ridge waveguide is typically formed on a substrate by forming a lower optical cladding, then forming through chemical vapor deposition, lithographic patterning, and etching, an optical core element, and lastly by surrounding the optical core element with an upper optical cladding layer. Other types of optical waveguides used in the formation of integrated optical devices and circuits include slab, ridge loaded, trench defined, and filled trench waveguides.

Further, semiconductor devices often include multiple layers of conductive, insulating, and semiconductive layers. Often, the desirable properties of such layers improve with the crystallinity of the layer. Attempts have been made to fabricate high quality crystalline optical waveguide devices. However, such attempts typically have succeeded only on bulk oxide substrates. Attempts to grow such devices on a single crystal semiconductor or compound semiconductors substrates, such as germanium, silicon, and various insulators, have generally been unsuccessful because crystal lattice mismatches between the host crystal of the substrate and the grown crystal of the optical waveguide layer have caused the resulting crystal of the optical waveguide layer to be of low crystalline quality.

Silicon (Si) is the most widely used semiconductor material in modern electronic devices. Single crystalline Si of high quality is readily available, and the processing and microfabrication of Si are well known. The transparency of Si in the near-infrared makes Si an ideal optical material.

In part due to these ideal optical properties, Si-based waveguides are often employed as optical interconnects on Si integrated circuits, or to distribute optical clock signals on an Si-based microprocessor. In these and other instances, Si provides improved integration with existing electronics and circuits. However, at present pure Si optical waveguide technology is not well developed, in part because fabrication of waveguides in Si requires a core with a higher refractive index than that of crystalline Si (c-Si).

Historically, optical links were single wavelength and point-to-point, with all functionality in the electronics domain. The implementation of telecommunication functions in the optical domain, in conjunction with the aforementioned development of the understanding of silicon as an optical material, led to the development of the optical integrated circuit (OEIC). The OEIC fabrication process borrows heavily from the electronic integrated circuit field, and as such may employ planar deposition, photolithography, and dry etching to form optical waveguides analogous to electronic circuit conductors.

Attempts to integrate voltage-controlled switching and attenuation functions into a silica glass platform exposed drawbacks stemming from the incorporation of classical IC technology for OEIC, including difficulty in processing optical materials with standard microelectronics fabrication equipment, a lack of repeatability, and high power consumption that caused chip-heating problems.

An additional challenge facing high-index contrast optical systems is control of refractive indexes during processing, such as to allow for proper coupling of light through, into and out of an OEIC. For example, particularly challenging is the coupling of light from a standard optical fiber or external light source to a silicon waveguide. A single-mode fiber core (n=1.5) typically has a diameter of 8 μm with a symmetric mode, but a silicon waveguide (n=3.45) is typically only a few micrometers in width with an asymmetric mode. To overcome these large differences in effective refractive index, complex waveguide coupling procedures must be implemented.

Therefore, a need exists for improving refractive index control in nitrogen doped amorphous silicon films for higher quality waveguide and arrayed waveguide grating applications.

BRIEF SUMMARY OF THE INVENTION

The present invention includes an apparatus, device, system and method for controlling the index of refraction of at least one layer of amorphous silicon-based film deposited on a substrate are disclosed. The apparatus, device, system and method include providing at least one volume of each of $N_2$, $SiH_4$, and He, and depositing the at least one layer of amorphous silicon-based film on the substrate by vapor deposition. The device may include a waveguide that includes at least one layer of amorphous silicon-based film, wherein the at least one layer of amorphous silicon-based film is deposited by vapor deposition using an at least one volume of each of $N_2$, $SiH_4$, and He.

Thus, the present invention improves refractive index control in nitrogen doped amorphous silicon for arrayed waveguide grating applications using N2, SiH4 gas flows during deposition.

BRIEF DESCRIPTION OF THE SEVERAL VIEWS OF THE DRAWINGS

For the present invention to be clearly understood and readily practiced, the present invention will be described in conjunction with the following figures, wherein like reference numerals represent like elements, and wherein:

FIG. 2 is a chart of the refractive index of a-Si films verses the flow of $N_2$:$SiH_4$ with the addition of He in a second set of experiments.

DETAILED DESCRIPTION OF THE INVENTION

Figure 1:
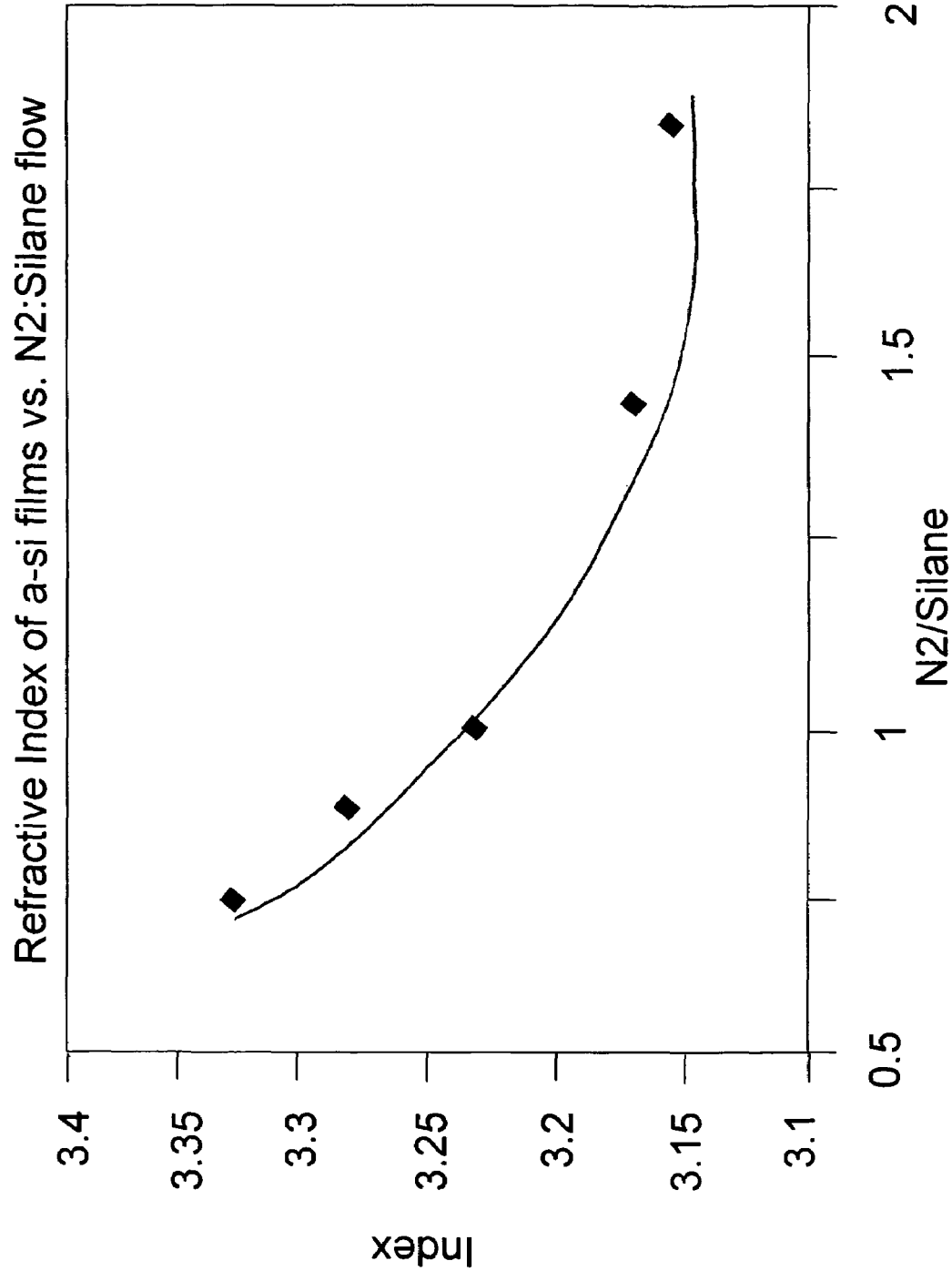
FIG. 1 is a chart of the refractive index of a-Si films verses the flow of $N_2$:$SiH_4$ in a first set of experiments.

It is to be understood that the figures and descriptions of the present invention have been simplified to illustrate elements that are relevant for a clear understanding of the present invention, while eliminating, for purposes of clarity, many other elements found in film deposition techniques. Those of ordinary skill in the art will recognize that other elements are desirable and/or required in order to implement the present invention. However, because such elements are well known in the art, and because they do not facilitate a better understanding of the present invention, a discussion of such elements is not provided herein.

Amorphous silicon (a-Si) presents advantageous properties as an Si-based waveguide core material. a-Si is a non-crystalline allotropic form of silicon. Silicon is normally tetrahedrally bonded to four neighboring silicon atoms, which is the case in amorphous silicon. However, unlike c-Si, a-Si does not form a continuous crystalline lattice. As such, some atoms in an a-Si structure may have "dangling bonds," which occur when one of the tetrahedral bonds of the a-Si does not bond to one of the four neighboring atoms. Thus, a-Si is "under-coordinated." The under-coordination of a-Si may be passivated by introducing hydrogen into the silicon. The introduction of hydrogen for passivation forms hydrogenated a-Si. Hydrogenated a-Si provides high electrical quality and relatively low optical absorption.

The density of pure silicon is lower than that of c-Si, and the refractive index of pure a-Si at near-infrared wavelengths is higher than that of c-Si. a-Si is thus serviceable as a waveguide core material on c-Si. However, as discussed above pure a-Si may contain a large density of point defects and dangling bonds, and as such the optical absorption by an a-Si core at near-infrared wavelengths may be significant without the aforementioned passivation.

Arrayed waveguide gratings (AWG) are widely used in material systems, such as silica systems, for multiplexing and demultiplexing of optical signals, such as of VV-DM signals. An AWG may combine or split, such as through a star coupler, optical signals of different wavelengths. An AWG preferably is comprised of a number of arrayed channel waveguides that, together, act as a spectrometric diffraction grating. Typically, light incoming, such as via a light fiber, enters the AWG at a multimode waveguide, and propagates through multiple single mode waveguides to a second multimode section, and finally light exits via a plurality of output fibers. The input and output points of the AWG may include couplers, such as the star coupler, to multiplex or de-multiplex multiple input wavelengths to a single output, or a single input into multiple wavelength, multiple outputs.

AWG's may be formed of hydrogenated amorphous silicon (a-Si). The present invention includes an integrated photonic device that may include an a-Si AWG, and that may include, for example, an Indium Gallium Arsenide Phosphide (InGaAsP) gain section. This integrated device may be a multi-wavelength laser with wavelengths determined by the AWG channels. Similar devices may use Indium Gallium Arsenide Phosphide/Indium Phosphide (InGaAsP/InP) materials for both gain sections and the AWG.

Hydrogenated a-Si films may be deposited using a number of different techniques, including plasma enhanced chemical vapor deposition (PECVD), RF sputtering, and hot-filament CVD. Hydrogen content, void density, structural properties, optical and electronic properties of hydrogenated a-Si films are critically dependent on the precise nature of the processing conditions by which the a-Si film is created. Hydrogenated a-Si provides better transparency in the near-infrared than pure a-Si, but pure a-Si can be processed more easily. Pure a-Si has larger thermal stability then hydrogenated a-Si.

Further, such a-Si films may be formed using PECVD to have properties different from those of pure a-Si. For example, an N2-based PECVD formation of a-Si may form an amorphous silicon nitride (a-SiNy). Silicon nitrides generally are used for a myriad of purposes in a variety of compound semi-conductor devices. Such uses include surface passivation, interlayer elements and capacitor dielectrics.

Generally, CVD is a process during which a substrate is exposed to one or more reactive gasses, which decompose on the surface of the substrate, leaving a deposited film. Volatile byproducts to the chemical reaction are typically produced, which may be removed by a flow of gas through the reaction chamber.

PECVD is a process during which one or more reactive gasses are used to form a solid conducting or insulating layer on a wafer surface, enhanced by using a vapor that contains particles of plasma that are electrically charged. The addition of plasma may enhance the rate of chemical reaction of the gasses. The main advantage that PECVD offers compared to the more conventional CVD process is that PECVD may be performed at a lower temperature. CVD typically requires the use of high temperatures to break the chemical bonds of the reactive gases and to release the desired species. Because PECVD may be performed at lower temperatures, the process may be used to deposit films on materials which may become damaged at the higher temperatures of a CVD process.

a-SiNy films may, as discussed above, be deposited by PECVD. PECVD may be used in applications in a variety of devices in which films are necessitated from a wide range of chemical compositions, hydrogen contents, bond structures, and different stress, typography, morphology, defect density and step coverage characteristics. A plasma enhanced thin-film process may be used generally to deposit and/or etch a thin film, and may include three interrelated mechanisms, namely plasma-phase reactions, particle transport, and surface-related reactions. Plasma-phase chemical reactions may be difficult to predict using conventional reaction algorithms, in part because the plasma phase system is thermodynamically in non-equilibrium, and has nonstoichiometric reactants. The two types of particles in the plasma phase may be charged (ions and electrons) and neutral (radicals, atoms, and molecules).

Particle transport may transport the two types of plasma phase particles to the substrate surface by ion acceleration (in the case of charged particles) and by diffusion (in the case of neutral particles). Surface reactions occur upon completion of the transport of the plasma particles to the substrate, and may be complicated by ion bombardment, the nonstoichiometric reactants, and surface temperature. The activation energies of the surface reactants may be a function of the temperature and the ion bombardment energy.

PECVD a-SiNy may be particularly complex with regard to deposition, as the hydrogen content, bond states, silicon to nitride ratio, and stress may be highly variable with deposition conditions. For example, high hydrogen concentrations may equate to a low threshold voltage. Further, low threshold voltages (Vth) may be obtained within a narrow range of refractive indexes, such as refractive indexes in the range of 1.85 to 1.9, for example.

Plasma power may be an important process parameter generally for deposition of silicon nitride films. Plasma power in a silicon nitride PECVD process may influence both the microscopic and macroscopic properties of the deposited films. Further, plasma power may affect film uniformity.

Refractive index is a material characteristic indicative of the amount by which the phase velocity of electromagnetic radiation is slowed in that material, relative to its velocity in a vacuum. It is usually given the symbol n, and defined for a material by: $n=\sqrt{\epsilon_r \mu_r}$, where $\epsilon_r$ is the material's relative permittivity, and $\mu_r$ is its relative permeability. For a non-magnetic material, $\mu_r$ is very close to 1, and therefore n is approximately $\sqrt{\epsilon_r}$. The phase velocity is defined as the rate at which the crests of the waveform propagate; that is, the rate at which the phase of the waveform is moving. The group velocity is the rate that the envelope of the waveform is propagating; that is, the rate of variation of the amplitude of the waveform. It is the group velocity that (almost always) represents the rate that information (and energy) may be transmitted by the wave, which is, for example, the velocity at which a pulse of light travels down an optical fiber.

Internal reflection is a requirement for the guidance or confinement of waves in a waveguide. Total internal reflection may only be achieved if the refractive index of the core is larger than the refractive index of the cladding. The reflection and refraction of light at an interface is governed by Snell's law. The angle of incidence is given by $\theta_1$ which is related to the angle of refraction $\theta_2$. With increasing angle of incidence $\theta_1$ the angle of refraction $\theta_2$ also increases. If $n_1 > n_2$, there comes a point when $\theta_2 = \pi/2$ radians. This happens when $\theta_1 = \sin^{-1}(n_2/n_1)$. For larger values of $\theta_1$, there is no refracted ray, and all the energy from the incident ray is reflected. This phenomena is called total internal reflection. The smallest angle for which there is total internal reflection is called the critical angle, and thereat $\theta_2$ equals $\pi/2$ radians.

Total (or substantially total) internal reflection is a requirement for guidance of light in an optical waveguide. Light under sufficient shallow angles, or angles greater than the critical angle, may propagate in the waveguide based upon total internal reflection. Rays that enter the waveguide within an acceptance cone, or angle, may thus propagate along the waveguide, whereas rays outside of the cone will be at an improper angle for total internal reflection in the subject waveguide, and thus will not be guided.

The present invention may incorporate a variety of CVD systems for controlling gas distribution for dispersing process gases to a substrate centered within a processing chamber. For example, during processing, the substrate may be positioned on a flat (or slightly convex) surface, and deposition and carrier gases may be introduced into the chamber through perforated holes in a gas distribution faceplate. Before reaching the substrate in the chamber, deposition and carrier gases may pass through a mixing system wherein they are combined before reaching the chamber.

As mentioned previously, the deposition process performed may be any type of CVD, such as a thermal process or a plasma-enhanced process, for example. In a plasma-enhanced process, an RF power supply applies electrical power between the gas distribution faceplate and the positioned substrate so as to excite the process gas mixture to form a plasma. Constituents of the plasma may react to deposit the desired film on the surface of the positioned substrate. The RF power supply may be a single or mixed frequency, whereby power may be supplied at variable frequencies to enhance the decomposition of reactive species introduced into the chamber. In a thermal process, the process gas mixture may thermally react to deposit the desired films on the surface of the positioned substrate, which may be resistively heated to provide thermal energy for the reaction. During a thermal deposition process, a constant temperature may be desired to prevent condensation of liquid precursors and reduce gas phase reactions that could create particles. Heating may beneficially reduce or eliminate condensation of undesirable reactant products and improve the elimination of volatile products of the process gases and other contaminants no gas flow.

Higher pressures generally increase gas phase reactions. If the gas phase reaction is too strong, final product may be formed in the gas phase above the substrate surfaces rather than on the surfaces. Flow rate of gasses into the chamber is also critical, as the flow rate may increase or decrease the rate of film deposition.

The remainder of the gas mixture that is not deposited in a layer, including reaction byproducts, may be evacuated from the chamber, such as by a vacuum pump, to help achieve a uniform flow of process gases over the substrate so as to deposit a uniform film.

As described herein, refractive index control may be improved in nitrogen doped a-Si films for AWG applications, wherein such films may be deposited by PECVD decomposition of N2, SiH4 and He. In addition to controlling gas composition temperature, pressure and flow rates, reftractive index control may also be achieved by adjusting the SiH4:N2 ratio, preferably while compensating with He flow. As explained herein, the addition of He may help to maintain a constant total flow volume.

In accordance with the present invention, refractive index of a-Si films was measured verses $N_2$ and $SiH_4$ (silane) flow in a deposition process. For example, 100 sccm silane and variable $N_2$ may be introduced under pressure of about 1.2 torr, temperature of about 250° C., and RF of about 140 W 13.56 MHz. As shown in FIG. 1, under these conditions, the index of refraction decreases as the ratio of $N_2/SiH_4$ increased, thus resulting in a varying total gas volume, and an exponential sensitivity of the refractive index to the gas ratio. Total flow of $N_2$ and $SiH_4$ may be varied from about 178 sccm to about 278 sccm.

In an exemplary embodiment of the present invention, helium, or other inert gas(es), such as argon, may be flowed into the chamber to stabilize the pressure in the chamber before reactive process gases are introduced. In this embodiment, the He may flow into the chamber for any amount of time necessary to stabilize the pressure in the chamber, and dilute the reactant such that a uniform reaction may be achieved. The inert gas flow aids in stabilizing the deposition process and improves the thickness uniformity of the deposited film, and consequently provides the desired refractive index in a more consistent manner. The inert gas should not include elements that incorporate into the film in any significant manner, or in any way adversely affect other film qualities.

In an additional exemplary embodiment, 100 sccm silane, $N_2$ varying from about 230 sccm to about 320 sccm, and He varying from about 300 sccm to about 400 sccm may be introduced under pressure of about 1.2 torr, temperature of about 200° C., and RF of about 40 W 13.56 MHz. As shown in FIG. 2, under these conditions, the index of refraction again decreases as the ratio of $N_2/SiH_4$ increased. However, with the addition of He to maintain a constant gas volume, the response of the refractive index to varying SiH4:N2 ratio is more linear and more gradual, providing a greater ability to control the index of refraction for the resulting deposited films.

Those of ordinary skill in the art will recognize that many modifications and variations of the present invention may be implemented. The foregoing description and the following claims are intended to cover all such modifications and variations falling within the scope of the following claims, and the equivalents thereof.

What is claimed is:

1. A method for providing an amorphous silicon-based film deposited on a substrate, said method comprising:
    providing gases consisting essentially of at least one volume of each of $N_2$, $SiH_4$ and compensating He;
    plasma enhanced chemical vapor depositing at least one layer of amorphous silicon-based film on said substrate using the gases; and
    varying only a ratio of $N_2$ to $SiH_4$ and a flow volume of He so that said plasma enhanced chemical vapor depositing uses a substantially constant total flow volume of $N_2$, $SiH_4$ and He whereby the index of refraction of the deposited at least one layer of amorphous silicon-based film is controlled.

2. The method of claim 1, further comprising maintaining a substantially constant flow of one of said at least one volume of each of $N_2$ and $SiH_4$.

3. The method of claim 2, further comprising adjusting said at least one volume of He to maintain said substantially constant total flow volume of He, $N_2$ and $SiH_4$.

4. The method of claim 1, wherein the depositing said at least one layer of amorphous silicon-based film on said substrate comprises thermally-enhanced plasma enhanced chemical vapor deposition.

5. The method of claim 1, wherein said amorphous silicon-based film deposited on the substrate forms at least one portion of a waveguide.

6. The method of claim 1, wherein said amorphous silicon-based film deposited on a substrate forms at least one portion of an arrayed waveguide grating.

7. An amorphous silicon based waveguide on a substrate, comprising:
    a waveguide core; and
    at least one cladding;
    wherein at least one of said core and said at least one cladding comprise a plasma enhanced chemical vapor deposited film characterized by plasma enhanced chemical vapor depositing onto the substrate using a flow volume consisting of at least one formation volume of each of $N_2$, $SiH_4$, and a compensating volume of He wherein only a ratio of $N_2$, to $SiH_4$ and a flow volume of He are varied and a substantially constant total flow volume of $N_2$, $SiH_4$ and He is maintained during formation of the plasma enhanced chemical vapor deposited film whereby the index of refraction of the deposited film is controlled.

8. The waveguide of claim 7, wherein said plasma enhanced chemical vapor deposition comprises a thermally enhanced, plasma enhanced chemical vapor deposition.

9. The waveguide of claim 7, wherein said waveguide forms part of an arrayed waveguide grating.

10. An optical device, comprising:
    a waveguide having at least one layer of amorphous silicon-based film,
    wherein said at least one layer of amorphous silicon-based film is characterized by plasma enhanced chemical vapor deposition of the film using a flow volume consisting of at least one volume of each of $N_2$, $SiH_4$, and a compensating volume of He, wherein only a ratio of $N_2$ to $SiH_4$ and a flow volume of He are varied and a total flow volume of $N_2$, $SiH_4$ and He is maintained substantially constant during formation of the plasma enhanced chemical vapor deposited film whereby the index of refraction of the deposited film is controlled.

11. The optical device of claim 10, wherein the plasma enhanced chemical vapor depositing uses a substantially constant flow of one of said at least one volume of each of $N_2$ and $SiH_4$ during deposition of said at least one layer of amorphous silicon-based film.

12. The optical device of claim 11, wherein said plasma enhanced chemical vapor depositing includes adjusting the least one volume of He to maintain a substantially constant total flow volume of said He, $N_2$ and $SiH_4$.

* * * * *